(12) United States Patent  
Kitagawa et al.

(10) Patent No.: US 8,848,468 B2  
(45) Date of Patent: Sep. 30, 2014

(54) SEMICONDUCTOR DEVICE AND CONTROL METHOD THEREOF FOR PERMITTING THE RECEPTION OF DATA ACCORDING TO A CONTROL SIGNAL

(75) Inventors: Katsuhiro Kitagawa, Tokyo (JP); Shotaro Kobayashi, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 346 days.

(21) Appl. No.: 13/213,913

(22) Filed: Aug. 19, 2011

(65) Prior Publication Data

US 2012/0044776 A1    Feb. 23, 2012

(30) Foreign Application Priority Data

Aug. 20, 2010 (JP) ................................. 2010-185268

(51) Int. Cl.
| G11C 7/00 | (2006.01) |
| G11C 7/22 | (2006.01) |
| G11C 7/10 | (2006.01) |
| G11C 11/4076 | (2006.01) |
| H03L 7/081 | (2006.01) |
| G11C 11/4093 | (2006.01) |

(52) U.S. Cl.
CPC ............ *G11C 11/4076* (2013.01); *G11C 7/222* (2013.01); *G11C 7/1078* (2013.01); *G11C 7/1093* (2013.01); *G11C 7/1084* (2013.01); *G11C 7/22* (2013.01); *H03L 7/0812* (2013.01); *G11C 11/4093* (2013.01)
USPC .......................................... 365/191; 365/194

(58) Field of Classification Search
CPC ........... G11C 11/4076; G11C 11/4093; G11C 7/1078; G11C 7/1084; G11C 7/1093; G11C 7/22; G11C 7/222
USPC ................. 365/76, 93, 194, 189.17, 191, 193
See application file for complete search history.

(56) References Cited

U.S. PATENT DOCUMENTS

| 6,088,253 | A  * | 7/2000  | Shimizu .......................... 365/51 |
| 6,195,305 | B1   | 2/2001  | Fujisawa et al. |
| 6,198,689 | B1   | 3/2001  | Yamazaki et al. |
| 6,667,913 | B2   | 12/2003 | Okuda et al. |
| 2002/0018396 | A1 * | 2/2002 | Morita et al. ................. 365/233 |
| 2003/0210577 | A1   | 11/2003 | Okuda et al. |
| 2005/0276145 | A1 * | 12/2005 | Casper et al. ................. 365/227 |
| 2009/0195279 | A1 * | 8/2009 | Lin ............................... 327/161 |
| 2010/0202225 | A1 * | 8/2010 | Lee ............................... 365/194 |
| 2011/0085387 | A1 * | 4/2011 | Lee .......................... 365/189.02 |

FOREIGN PATENT DOCUMENTS

| JP | 10-326488 A | 12/1998 |
| JP | 11-297950 A | 10/1999 |
| JP | 2000-163963 A | 6/2000 |
| JP | 2003-331577 A | 11/2003 |
| JP | 2008-034098 A | 2/2008 |

* cited by examiner

*Primary Examiner* — Vanthu Nguyen  
*Assistant Examiner* — Khamdan Alrobaie  
(74) *Attorney, Agent, or Firm* — Sughrue Mion, PLLC

(57) ABSTRACT

A semiconductor device comprises: a control signal generating circuit that generates and outputs a control signal that is in an active state during a period around at least one of rising edges and falling edges of a clock signal; and a data input circuit that is controlled to be in an active state, in which a data signal can be received, while the control signal is in an active state, and otherwise controlled to be in an inactive state.

16 Claims, 17 Drawing Sheets

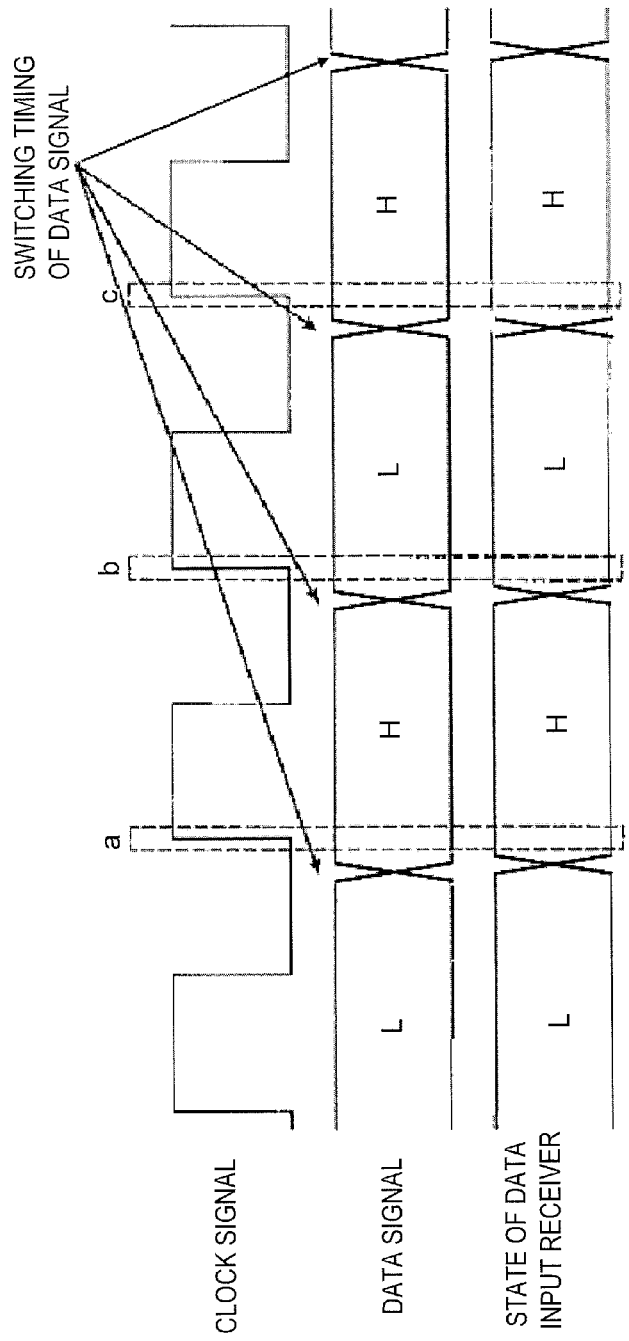
FIG. 17 RELATEED ART

SEMICONDUCTOR DEVICE AND CONTROL METHOD THEREOF FOR PERMITTING THE RECEPTION OF DATA ACCORDING TO A CONTROL SIGNAL

TECHNICAL FIELD

Reference To Related Application

This application is based upon and claims the benefit of the priority of Japanese patent application No. 2010-185268, filed on Aug. 20, 2010, the disclosure of which is incorporated herein in its entirety by reference thereto. This disclosure relates to a semiconductor device and a control method thereof.

BACKGROUND

In semiconductor devices such as a DRAM (Dynamic Random Access Memory), an input circuit that amplifies an input signal with a small amplitude and transmits the amplified signal is employed as a passive circuit for receiving the input signal. Therefore, the input circuit consumes electric power even in a standby state when no input signal is received.

Since data width in semiconductor devices has increased in recent years, many input circuits must be provided on the semiconductor devices and power consumption in the input circuits has increased accordingly. Therefore, it is important to reduce standby electric power consumed in the input circuits.

For example, Patent Document 1 describes a technology in which leak current is reduced by activating an input circuit in accordance with a write command.
[Patent Document 1]
JP Patent Kokai Publication No. JP-P2008-034098A
[Patent Document 2]
JP Patent Kokai Publication No. JP-H11-297950A which corresponds to U.S. Pat. No. 6,195,305B1

SUMMARY

The entire disclosures of above Patent Documents are incorporated herein by reference thereto. The following analysis are given according to the views of the present disclosure.

According to the technology described in Patent Document 1, in which an input circuit is activated in accordance with a write command, there occurs the following problem. Since an address input buffer maintains an activated state while the buffer is activated, the buffer consumes large electric power in the period. Therefore, there is a need in the art to reduce electric power consumption during an input standby period in a data input circuit such as an address input buffer.

According to a first aspect of the present disclosure, there is provided a semiconductor device comprising:
a control signal generating circuit that generates a control signal that is in an active state during a period around at least one of rising edges and falling edges of a clock signal and otherwise in an inactive state; and
a data input circuit that receives the control signal and is controlled to be in an active state, in which a data signal can be received, while the control signal is in an active state, and controlled to be in an inactive state, in which a data signal cannot be received, while the control signal is in an inactive state.

According to a second aspect of the present disclosure, there is provided a semiconductor device control method, comprising:
delaying a clock signal by a predetermined period of time;
generating a control signal that is in an active state during a period around at least one of rising edges and falling edges of the clock signal by referring to the delayed clock signal; and
forcing a data input circuit to be in a standby state, in which a data signal can be received, while the control signal is in an active state, and otherwise forcing the data input circuit to be in a terminated state.

The meritorious effects of the present disclosure are summarized as follows, but not restricted thereto. In a semiconductor device and a control method thereof according to the present disclosure, the data input circuit is caused to be in a terminated state other than a period in which the control signal is in an active state. Therefore, electric power consumption in the data input circuit can be reduced.

BRIEF DESCRIPTION OF THE DRAWINGS

FIG. 17 is a timing chart illustrating an operation of a conventional semiconductor device.

PREFERRED MODES

Figure 1:
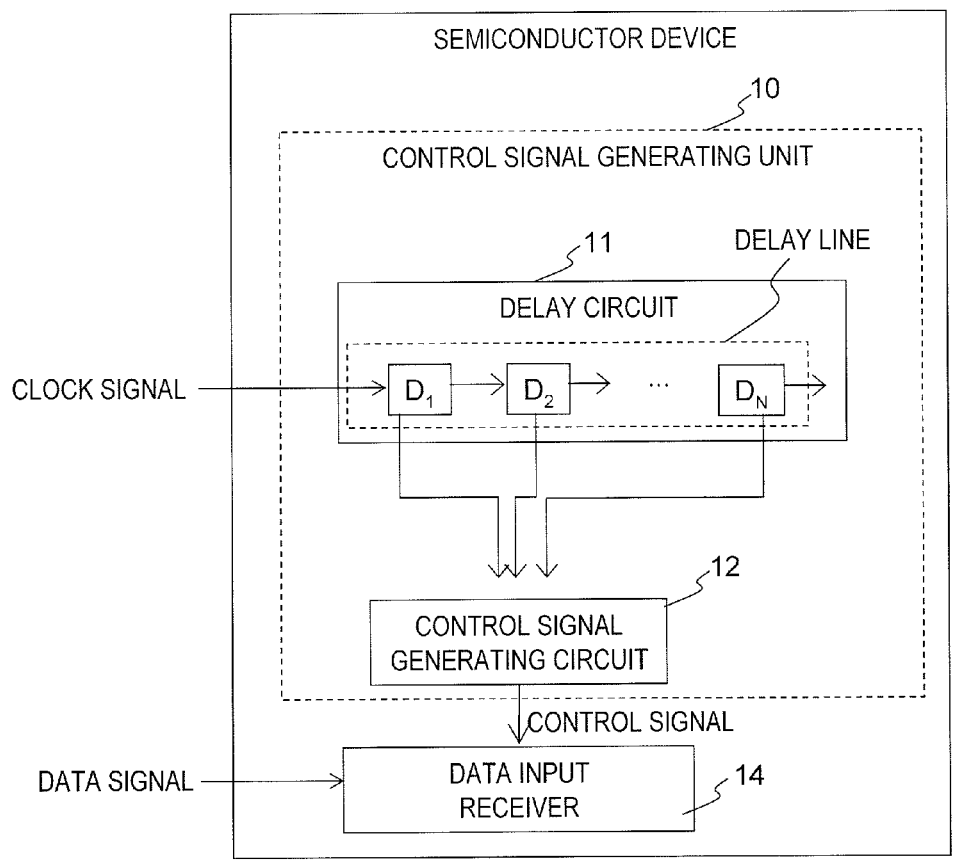
FIG. 1 is a block diagram illustrating an example of a structure of a semiconductor device according to an exemplary embodiment.

<Exemplary Embodiment>
With reference to FIG. 1, a semiconductor device according to an exemplary embodiment comprises a control signal generating unit 10 and a data input receiver (data input front stage circuit) 14. The control signal generating unit 10 generates a control signal that is in an active state during a period around at least one of rising edges and falling edges of a clock signal and outputs the control signal. The data input receiver 14 receives the control signal and is in an active state, in which a data signal can be received, while the control signal is in an active state and otherwise in a terminated state.

According to the structure described above, the data input receiver 14 is in an activated state, in which a data signal can be received, during a period around at least one of rising edges and falling edges of a clock signal, and otherwise in an inactive state, i.e., a terminated state. Since the data input receiver 14 is in a terminated state in the above period when data reception is unnecessary, it is possible to reduce electric power consumption in the data input receiver 14. Note that, by employing an input circuit instead of the data input font stage circuit 14, it is possible to reduce electric power consumption in the input circuit.

Hereinafter, it is assumed that clock and data signals are synchronized each other, and that the clock signal is supplied to the semiconductor device before the data signal to be received is supplied.

FIRST EXAMPLE

A semiconductor device according to a first example is described in detail with reference to FIG. 1.

With reference to FIG. 1, a semiconductor device in the first example comprises a control signal generating unit 10 and a data input receiver 14. The control signal generating unit 10 generates a control signal that is in an active state during a period around at least one of rising edges and falling edges of a clock signal and outputs the control signal. The data input receiver 14 receives the control signal and is in an active state, in which a data signal can be received, while the control signal is in an active state and otherwise in a terminated state.

The control signal generating unit 10 comprises a delay circuit 11 and a control signal generating unit 12. The delay circuit 11 receives a clock signal supplied to the semiconductor device, delays the clock signal, and outputs the delayed clock signal. The control signal generating circuit 12, based on the signal outputted from the delay circuit 11, generates a control signal that is in an active state during a period around at least one of rising edges and falling edges of the clock signal, and outputs the control signal.

In the present example, the delay circuit 11 outputs a plurality of delayed clock signals given by delaying the clock signal. Moreover, the control signal generating circuit 12 generates the control signal by selecting a clock signal with a required delay value from the plurality of delayed clock signals.

The data input receiver 14 receives a control signal outputted from the control signal generating circuit 12, maintains a standby state, in which a data signal can be received, while the control signal is in an active state, and otherwise maintains a terminated state.

According to the structure described above, the data input receiver 14 maintains a standby state, in which a data signal can be received, during a period around at least one of rising edges and falling edges of the clock signal, and otherwise maintains a terminated state. Therefore, the data input receiver 14 is in a standby state during a period immediately before and after a timing at which a data signal is received (at least one of rising edges and falling edges), and otherwise the data input receiver 14 is in a terminated state. In this way, electric power consumption of the data input receiver 14 can be reduced.

Figure 2:
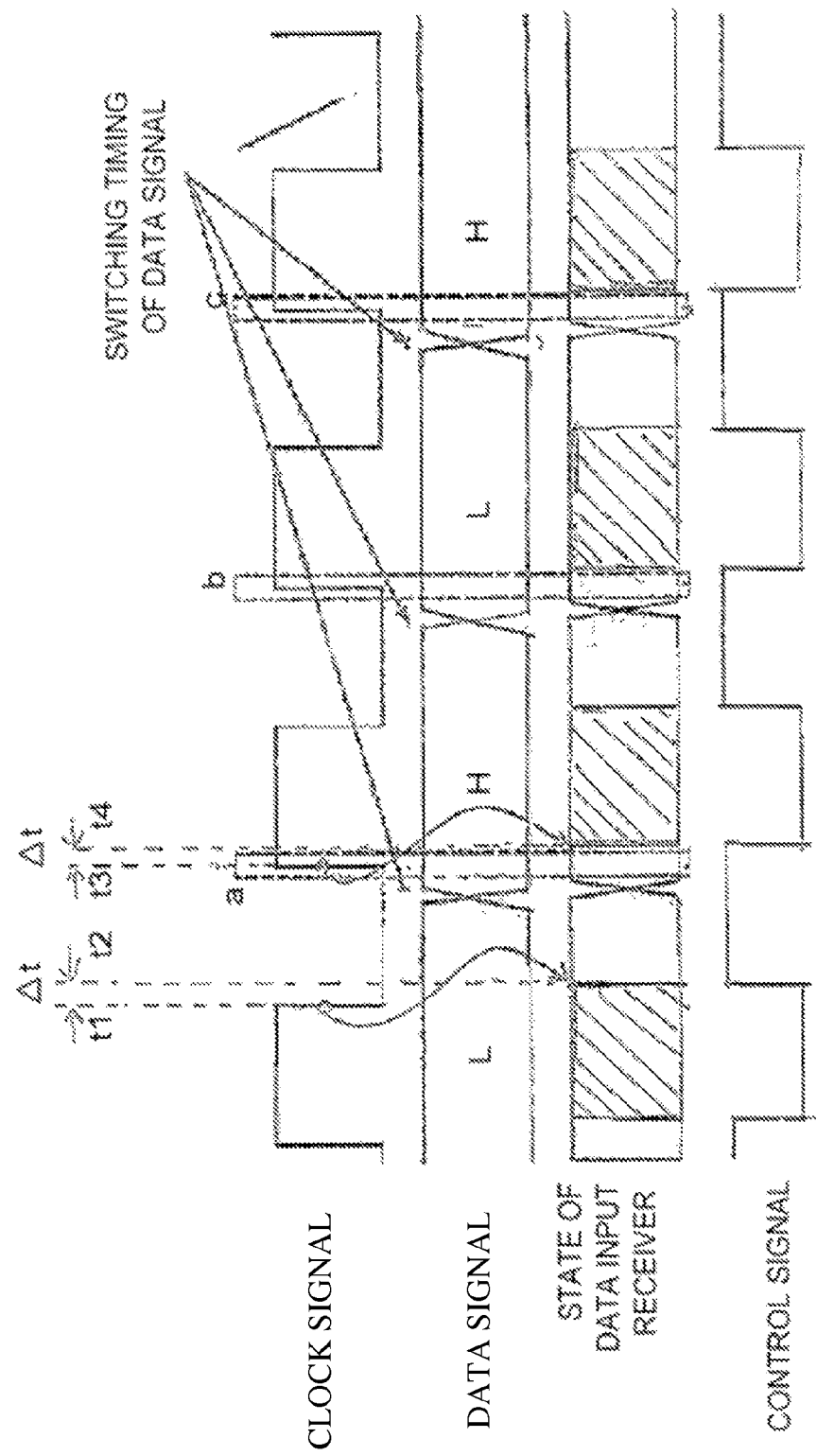
FIG. 2 is a timing chart illustrating an example of an operation of a semiconductor device in a first example.

In detail, as shown in FIG. 2, the control signal generating circuit 12 generates a control signal in an activated state (high level) at a timing t2, given by delaying a timing t1 by a predetermined time $\Delta t$, and maintains an activated state during a period while the clock signal is in a low level. Next, the control signal generating circuit 12 forces the control signal to a non-activated state (low level) at a timing t4, given by delaying a timing t3 by the predetermined time $\Delta t$, in order to force the data input receiver 14 to be in a non-activated state. In this way, a data signal with H level can be received during a period, in which data is received at a rising edge enclosed by a dashed line a. Since the control signal generating circuit 12 maintains the control signal in a non-activated state in a period other than the period, i.e., a period when the clock signal is in a high level, power consumption can be reduced. It is assumed in the present example that a rising edge of the clock signal appears a predetermined time later than the switching timing of the data signal.

FIG. 17 is a timing chart illustrating an operation of a conventional semiconductor device. With reference to FIG. 17, the data input receiver is in a standby state during the entire period. Therefore, the data input receiver in the conventional semiconductor device consumes in vain standby electric power during a period other than a period in which data is received, located immediately before and after the rising edge of the clock signal.

Since a data signal is latched at a rising edge of the clock signal in FIG. 2, the control signal is activated while the clock signal is in a low level and deactivated while the clock signal is in a high level. By employing a reverse clock signal obtained by reversing the clock signal instead of the clock signal, a structure, in which a data signal is latched at a falling edge of the reverse clock signal, can also be adopted.

For the sake of simplicity of the circuit, a case, in which a delay circuit delays the rising edge and the falling edge of the clock signal by a predetermined period $\Delta t$, is described in the above example. In this case, the data input receiver 14 can be deactivated only during a period between the rising edge and the falling edge of the clock signal, i.e., while the clock signal is in the high or low level. This means that electric power consumption cannot be reduced more than one half when the duty ration of the clock signal is 50%.

Figure 3:
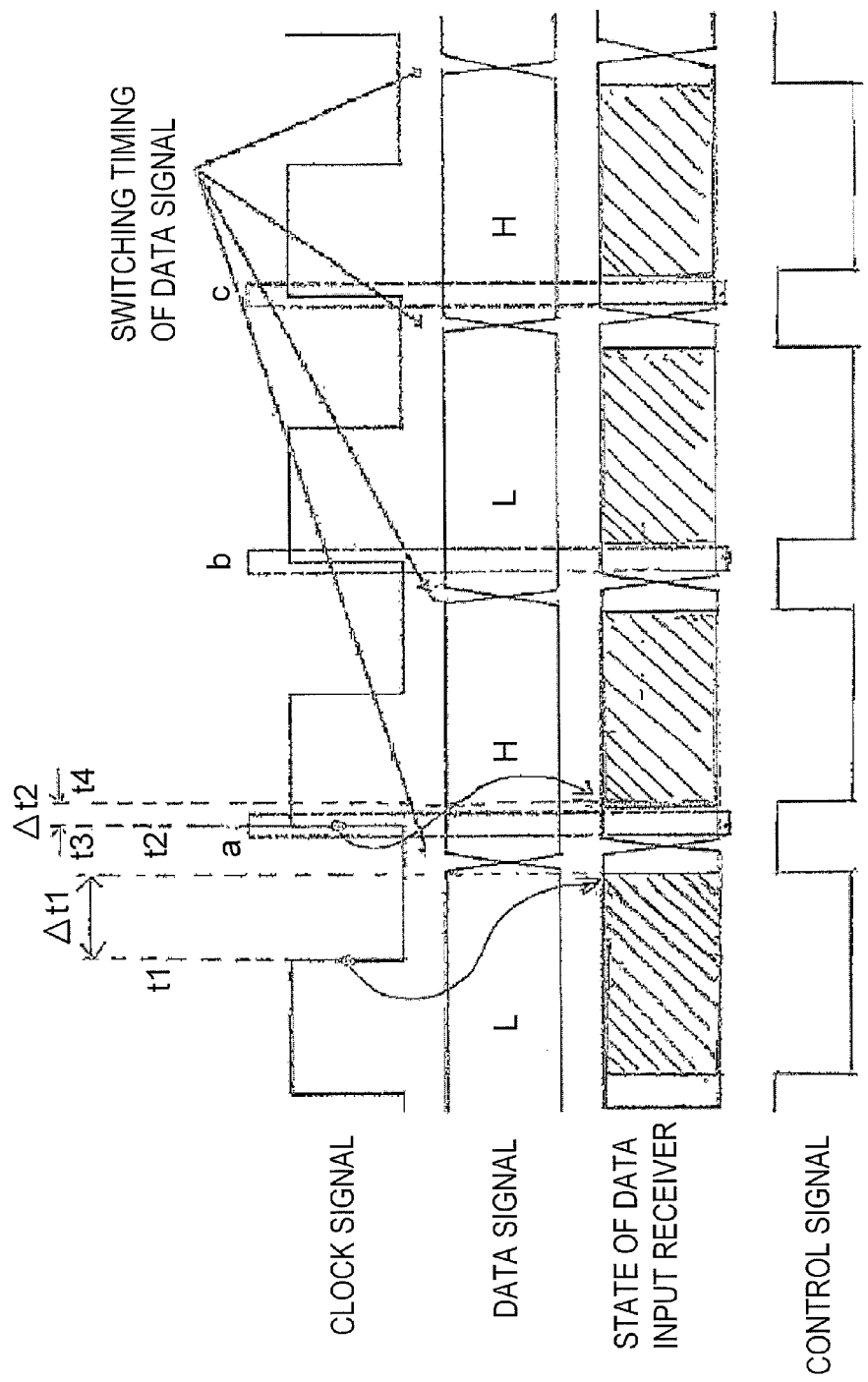
FIG. 3 is a timing chart illustrating an example of an operation of a semiconductor device in a first example.

FIG. 3 illustrates how to overcome this problem. With reference to FIG. 3, the control signal generating circuit 12 changes the control signal to an activated state at a timing t2, later than a timing t1 of a falling edge of the clock signal by a predetermined period $\Delta t1$. The control signal generating circuit 12 changes the control signal to a non-activated state at a timing t4, later than a timing t3 of a rising edge of the clock signal by a predetermined period $\Delta t2$. Further, the predetermined periods $\Delta t1$ and $\Delta t2$ are set to satisfy the relation $\Delta t1 > \Delta t2$. In this way, the period, in which the control signal is in an activated stated, can be reduced from the period illustrated in FIG. 2. Therefore, electric power consumption of the data input receiver 14 can be reduced further.

By employing predetermined periods $\Delta t1$ and $\Delta t2$ that satisfy the relation $\Delta t1 > \Delta t2$, the present disclosure can also be applied to a structure, in which a data signal is received at both rising and falling edges of the clock signal.

Figure 4:
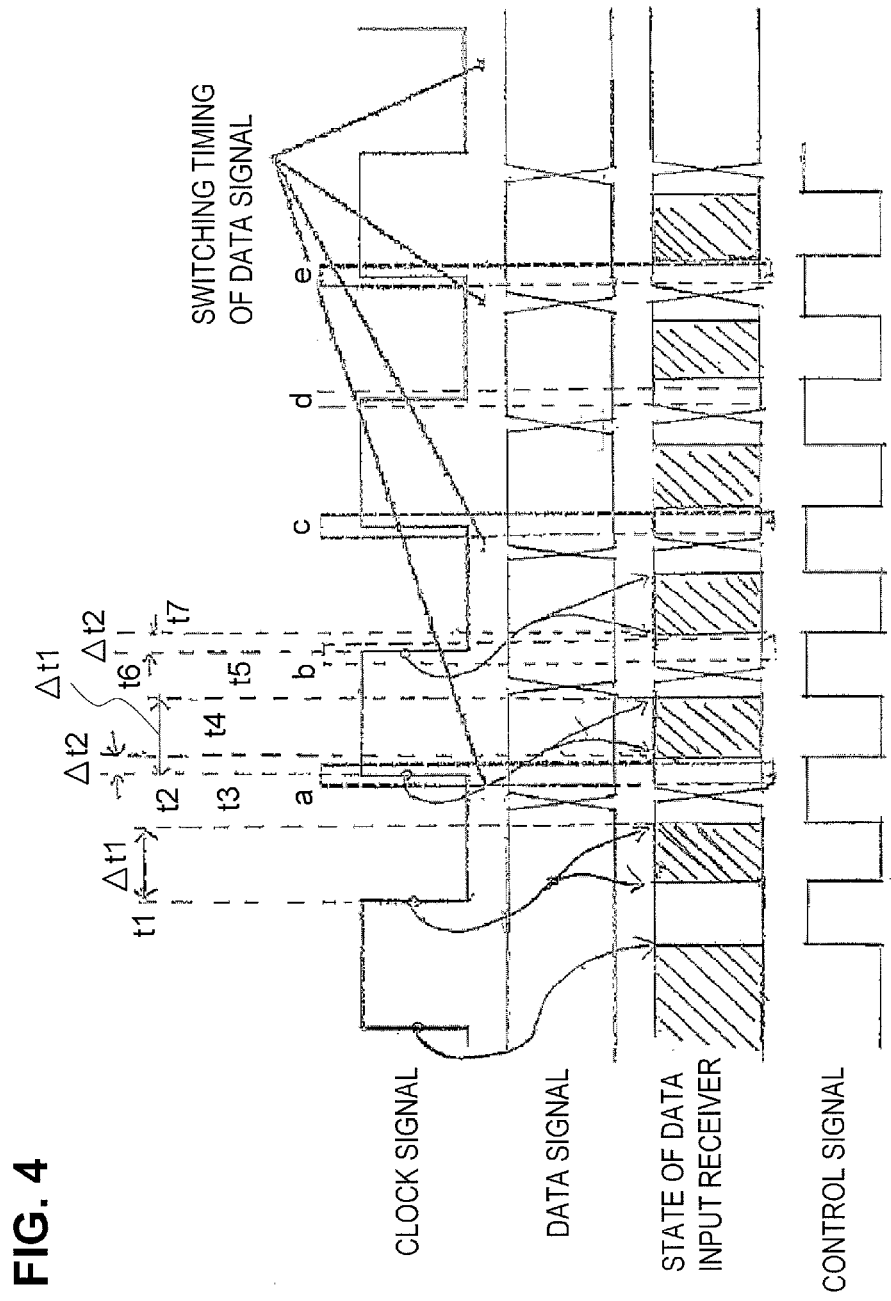
FIG. 4 is a timing chart illustrating an example of an operation of a semiconductor device in a first example.

As shown in FIG. 4, to receive a data signal at a timing indicated by a dashed line "a", the control signal generating circuit 12 sets the control signal to the high level in order for the data input receiver 14 to be activated at a timing t2, obtained by delaying the previous timing t1 (falling edge) of the clock signal by Δt1. The data input receiver 14 receives a data signal at a rising edge of the clock signal at a timing t3. The control signal generating circuit 12 sets the control signal to the low level in order for the data input receiver 14 to be deactivated at a timing t4, a predetermined period Δt2 later than the timing t3. The control signal generating circuit 12 outputs a low level control signal at a timing t4 in order to deactivate the data input receiver 14 and outputs a high level control signal at a timing t5, a predetermined period Δt1 later than the timing t3, in order to activate the data input receiver 14. In this way, the data input receiver 14 receives a data signal at a timing indicated by a dashed line "b", i.e., at a timing t6 of a falling edge of the clock signal. Next, the control signal generating circuit 12 sets the control signal to the low level in order for the data input receiver 14 to be deactivated at a timing t7, a predetermined period Δt2 later than the timing t6.

The predetermined periods Δt1 and Δt2 can be adjusted, based on a set up time and hold time to latch a data signal, while satisfying these times.

Analogous operations are repeated at timings indicated by dashed lines "c", "d" and "e." Since the data input receiver 14 is activated only during a predetermined period, in which data is received, and deactivated during a period other than that, electric power consumption of the data input receiver 14 can be reduced. Note that it is assumed in FIG. 4 that data before the one latched at a timing indicated by a dashed line "a" is unknown (don't care).

Figure 5:
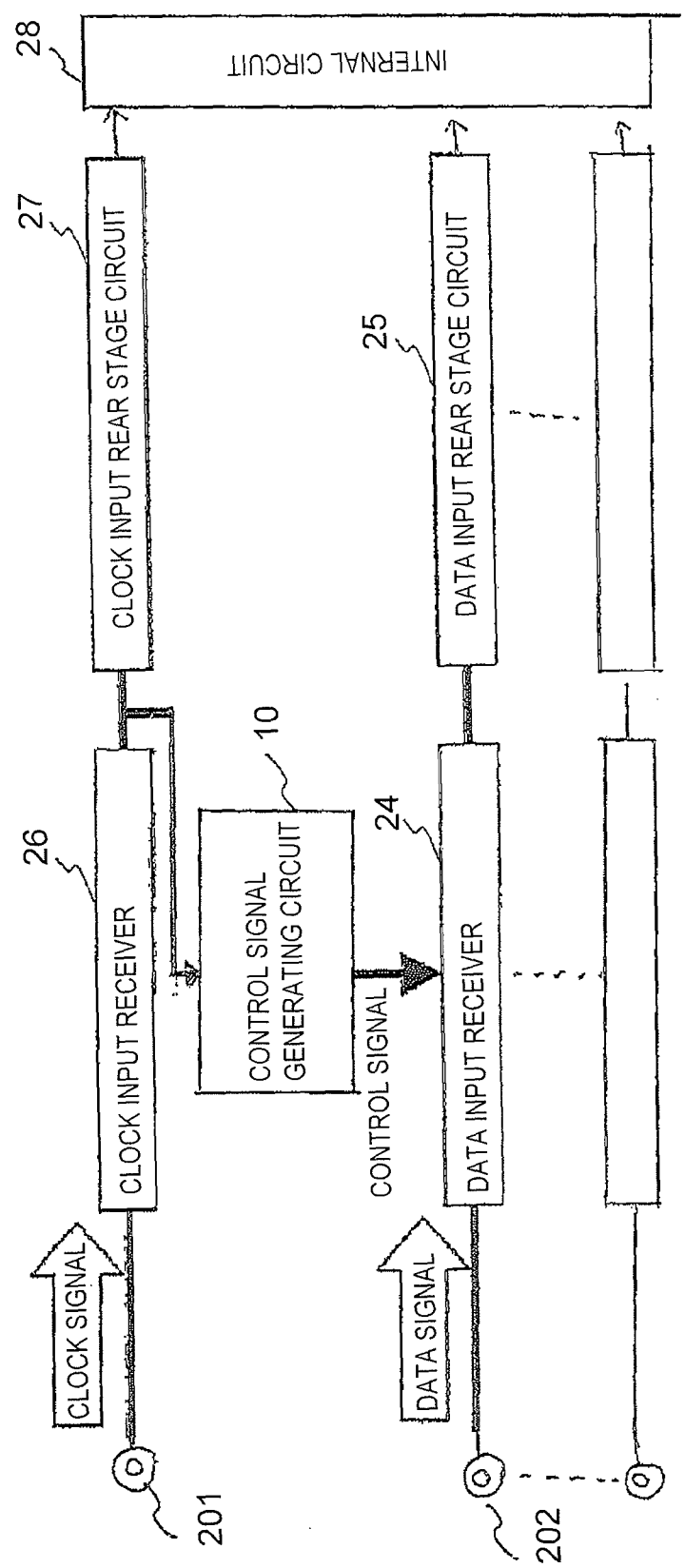
FIG. 5 is a block diagram illustrating an example of a structure of a semiconductor device in a first example.

A case in which the control signal generating circuit described above is applied to a semiconductor chip is described with reference to FIG. 5. The semiconductor chip comprises a clock signal input terminal 201 that receives a clock signal externally and a data input terminal 202 that receives a data signal. A clock signal and a data signal are supplied, respectively to a clock receiver (clock input front stage circuit) 26 and a data input receiver 24 through the clock signal input terminal 201 and the data input terminal 202. The control signal generating unit 10 described above receives a clock signal outputted from the clock receiver 26 and supplies a control signal to the data input receiver 24. The data input receiver 24 is activated and deactivated by the control signal and supplies the received data signal to the data input rear stage circuit 25. In a similar manner, the clock receiver 26 supplies the received clock signal to the clock input rear stage circuit 27. The internal circuit 28 receives the data signal and the clock signal, respectively, from the data input rear stage circuit 25 and the clock input rear stage circuit 27 and performs a predetermined operation.

By controlling the activation and deactivation of the input receiver in this way through the control signal generating unit 10, electric power consumed by the input receiver can be reduced.

SECOND EXAMPLE

A semiconductor device according to a second example of the present disclosure, with a phase synchronization mechanism of input signals such as a delay locked loop (DLL), is described. Control can be done more easily in a semiconductor device with a DLL than in a semiconductor device without a DLL as in the first example.

In the first example, i.e., in a semiconductor device without a phase synchronization mechanism of input signals, a falling edge of the internal clock signal is detected in order to receive a data signal at a timing of a rising edge of the clock signal. Therefore, when the present disclosure is applied to a DRAM such as a DDR-SDRAM that receives a data signal in synchronization with both rising and falling edges of the clock signal, predetermined periods Δt1 and Δt2 must be set as delay times appropriately, and the periods need to be adjusted for each product.

In the present example, by utilizing a phase synchronization mechanism such as a DLL, standby electric power is reduced, and control of reception of a data signal at both rising and falling edges of the clock signal is made easier.

Figure 6:
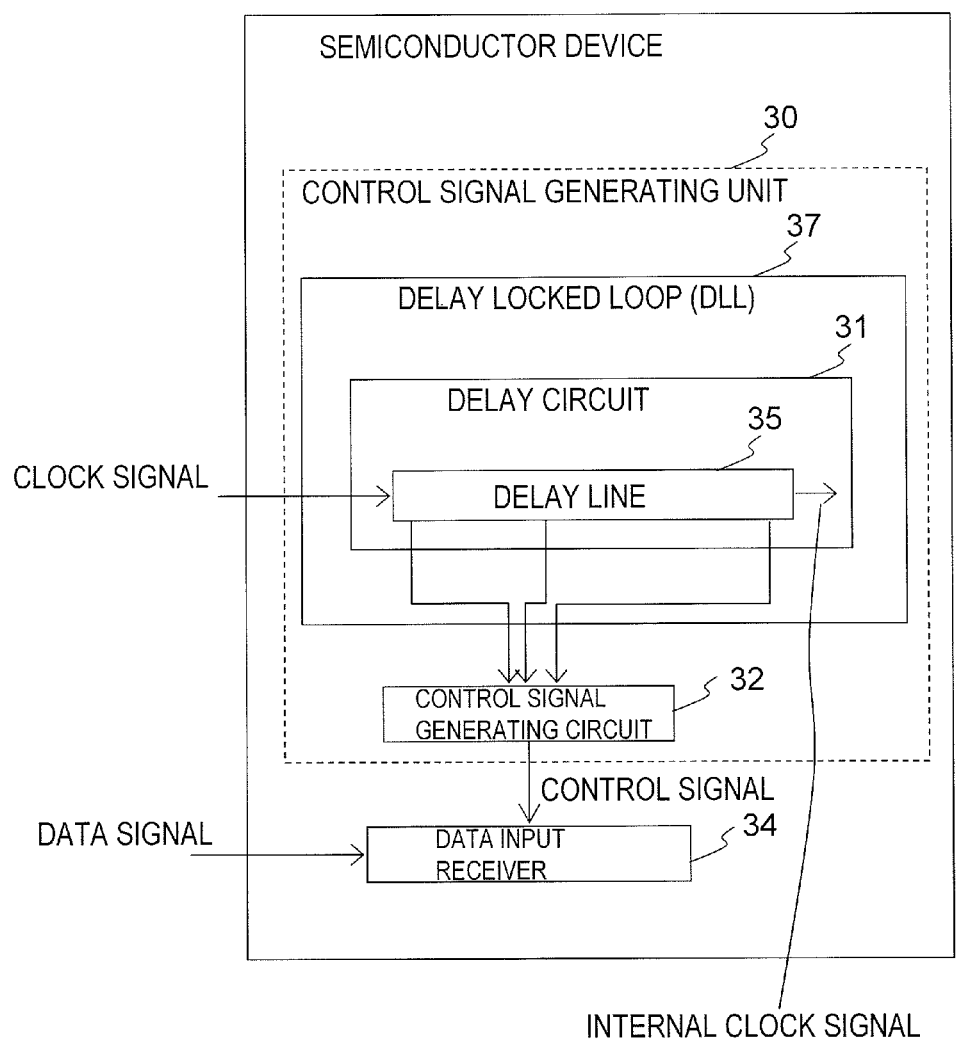
FIG. 6 is a block diagram illustrating an example of a structure of a semiconductor device in a second example.

A structure of a semiconductor device is described with reference to a block diagram shown in FIG. 6 that illustrates an example of the structure. The semiconductor device in the present example comprises a control signal generating unit 30 and a data input receiver 34. The control signal generating circuit 30 comprises a delay locked loop (DLL) 37 that includes a delay circuit 31 composed of a delay line 35.

The DLL 27 is a circuit that establishes phase synchronization between input and output signals. Therefore, in a case where the semiconductor device is a DRAM and while the DLL 37 is effective, the output signal of the DRAM is in the same phase with the clock signal. The DLL 37 comprises a delay line (delay add element) that adds an appropriate delay to the input signal in order to establish phase synchronization between input and output signals.

Figure 7:
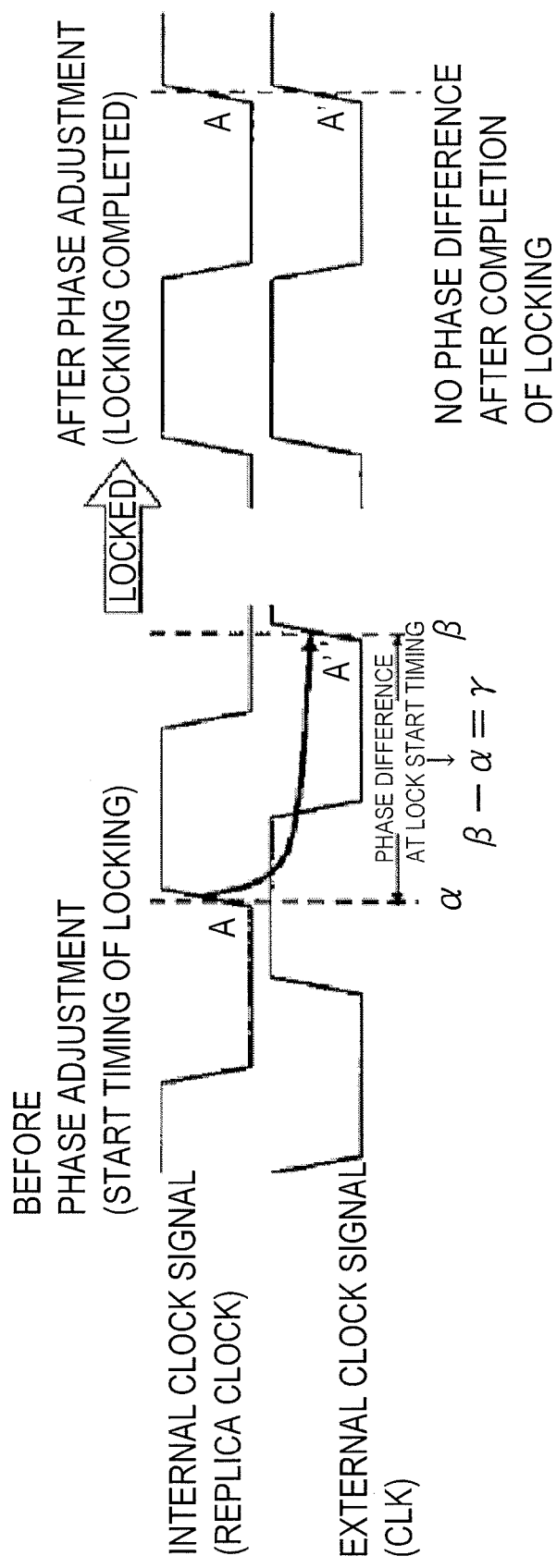
FIGS. 7A and 7B are timing charts illustrating an example of an operation of a DLL included in a semiconductor device in a second example.

At first, an operation of the DLL 37 is described with reference to timing charts shown in FIGS. 7A and 7B. Upper part of the timing chart illustrates an internal clock signal (replica clock) outputted from the delay line 35. Lower part of the timing chart illustrates a clock signal inputted externally. FIG. 7A illustrates a timing chart before phase adjustment. FIG. 7B illustrates a timing chart after phase adjustment (after phase locking). With reference to FIG. 7A, when phase synchronization is established between the input and the output signal, i.e., phase locking is established by the DLL 37, a delay of $\gamma(=\beta-\alpha)$ is added to the clock signal.

Figure 8:
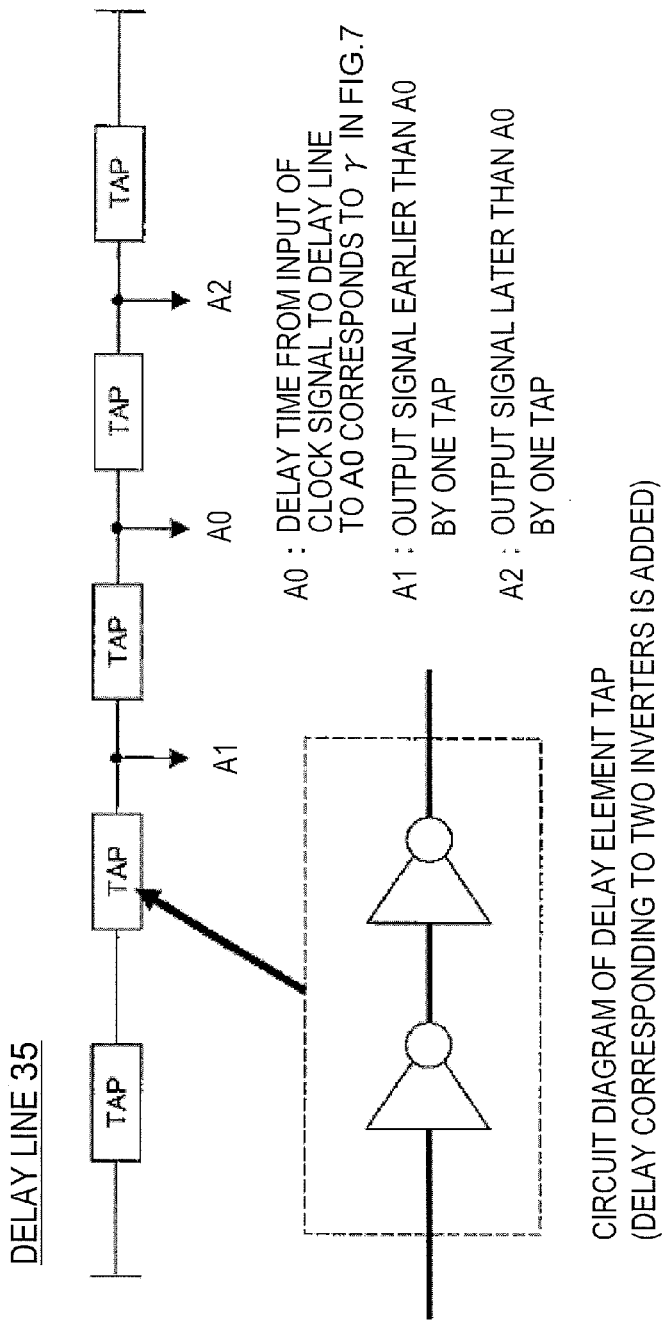
FIG. 8 is a block diagram illustrating an example of a structure of a delay line included in a delay circuit of a semiconductor device in a second example.

FIG. 8 is a block diagram illustrating an example of a structure of the delay line 35 included in the DLL 37. FIG. 8 schematically illustrates an inverter chain type delay line. It is assumed here that the signal A0 has a delay $\gamma$. Namely, when the DLL 37 is locked, the DLL output is given by the signal A0.

Next, consideration is paid to the signals A0 and A2, outputted from the TAPs located to the front and the rear the TAP that outputs the signal A0. The signal A1 is outputted earlier than the signal A0 by the delay time corresponding to a single delay element (TAP). The signal A2 is outputted later than the signal A0 by a delay time that corresponds to a single TAP. In a case as shown in FIG. 8, each delay element (TAP) adds a delay that corresponds to two inverters.

In the present example, the signals A1 and A2 are utilized in order to reduce electric power consumption in the data input receiver 34. To put it more precisely, the data input receiver 34 is forced to make a transition from a terminated state to a standby state at rising and falling edges of the signal A1, and is also forced to make a transition from a standby state to a terminated state at rising and falling edges of the signal A2.

Figure 9:
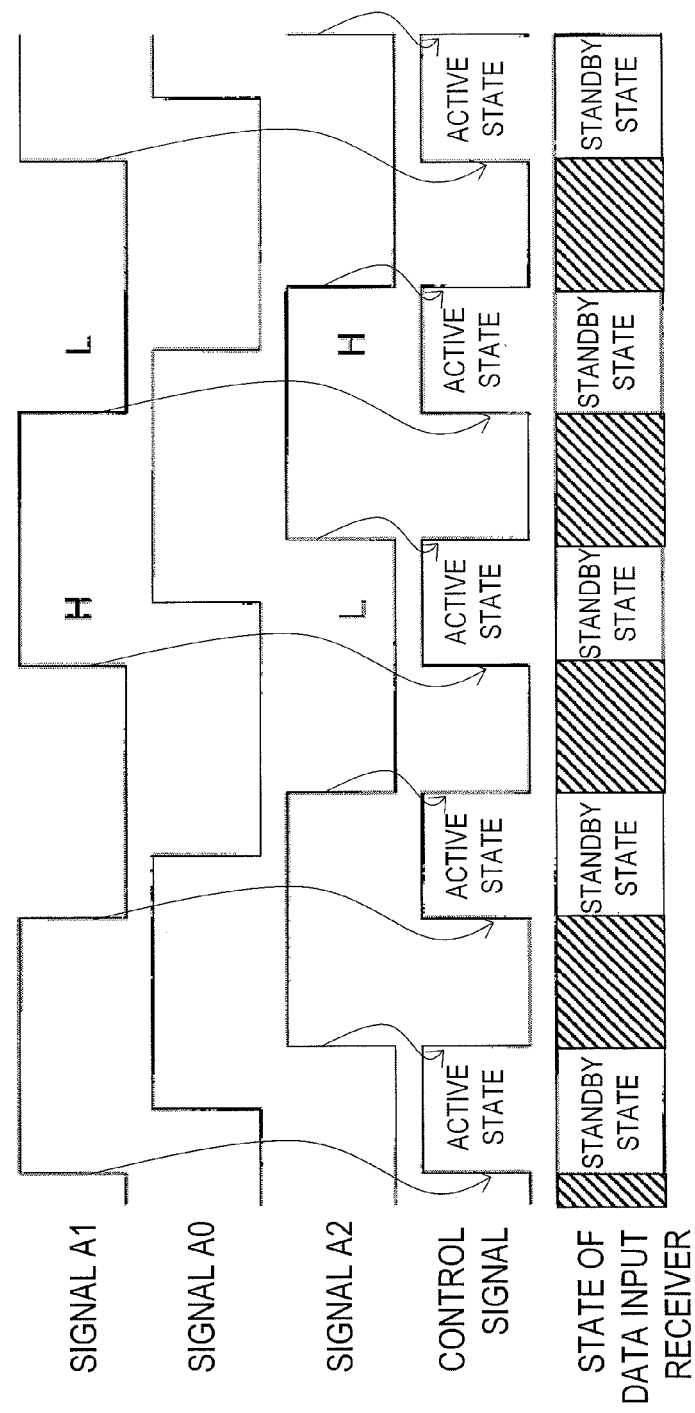
FIG. 9 is a timing chart illustrating an example of a control signal in a semiconductor device in a second example.

The control signal generating circuit 32 performs an exclusive OR (XOR) between the signal A1 and the signal A2 and outputs the result as a control signal. FIG. 9 is a timing chart illustrating an example of an operation of the control signal generating circuit 32. With reference to FIG. 9, a rising edge of the signal A0 exists between a rising edge of the signal A1 and a rising edge of the signal A2. In a similar manner, a falling edge of the signal A0 exists between a falling edge of the signal A1 and the falling edge of the signal A2. Therefore, the data input receiver 34 is in a standby state only during a period, in which the signal A1 and the signal A2 are out of phase, i.e., the control signal is in a high level. In this case, the data input receiver 34 is in a state, in which data can be received, only during a period immediately before and after a timing at which a data signal is received.

More precisely, the data input receiver 34 can receive a data signal inputted at a timing of a rising edge of the clock signal, during a period in which the signal A1 is in a high level and the signal A2 is in a low level. In a similar manner, the data input receiver 34 can receive a data signal inputted at a timing of a rising edge of the clock signal, during a period in which the signal A1 is in a low level and the signal A2 is in a high level. In both of these cases, a rising/falling edge of the signal A0 (the DLL output signal that is output when the DLL is locked) is located between a rising/falling edge of the signal A1 and a rising/falling edge of the signal A2, and the signal A0 is in synchronization with the external clock signal. Therefore, the data input receiver 34 is kept in an effective state only during a short period immediately before and after a rising or falling edge of the clock signal.

For simplicity in explanation, a case is described in which the delay line 35 includes five TAPs. However, the delay line 35 may include further TAPs other than these five ones.

Figure 10:
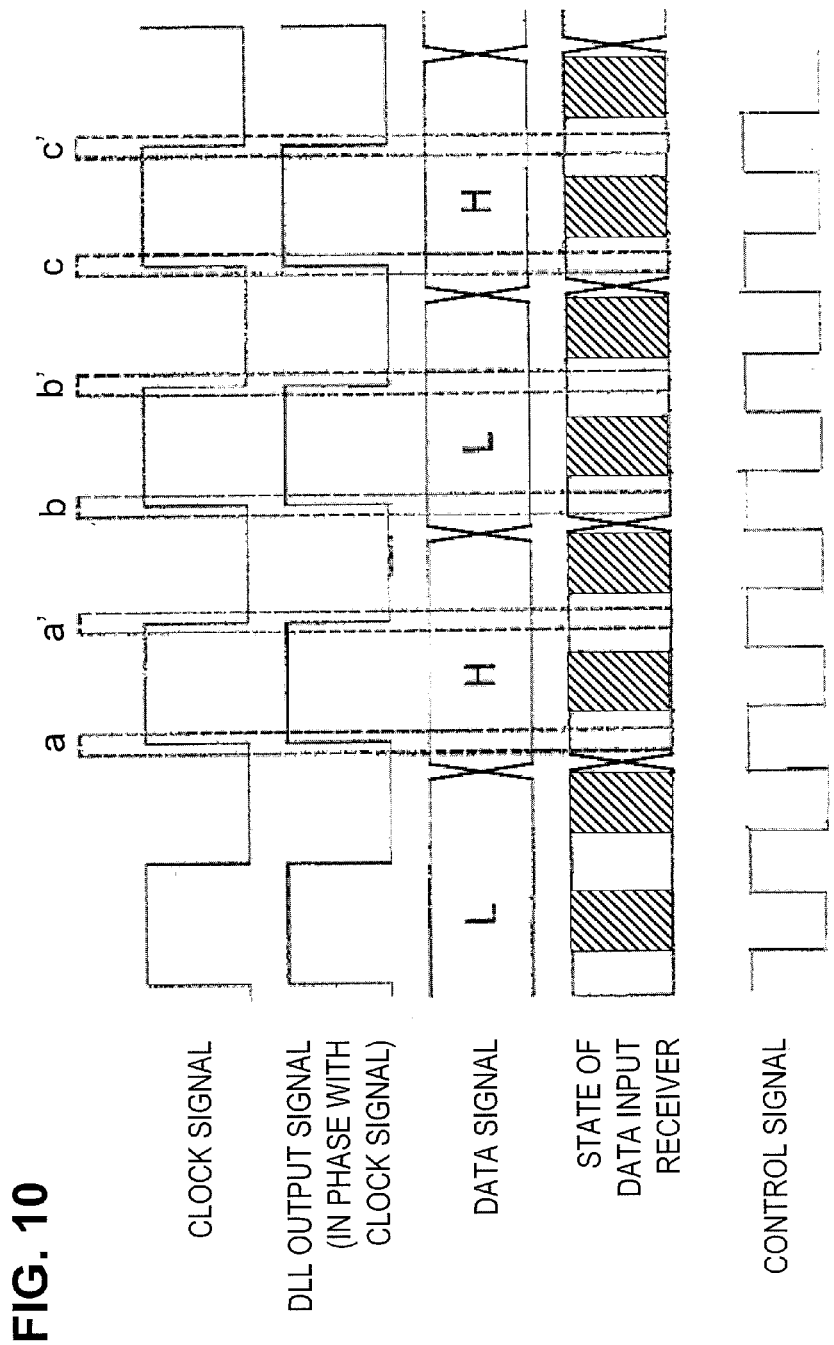
FIG. 10 is a timing chart illustrating an example of an operation of a semiconductor device in a second example.

In the case described above, an activated state of the control signal is generated using signals A1 and A2 outputted from the TAPs located both sides of the TAP that outputs the signal A0. Needless to say, in accordance with the set up time and the hold time, a signal A3 earlier than the signal A0 by a delay time corresponding to two TAPs and a signal A4 later than the clock signal A0 by a delay time corresponding to two TAPs can be utilized, instead of the signals A1 and A2 adjacent to the signal A0. Namely, appropriate outputs from these TAPs should be used in accordance with the set up time and the hold time, an An operation of the semiconductor device according to the present example is described with reference to a timing chart shown in FIG. 10 that illustrates an example of the operation. The data input receiver 34, in accordance with the control signal outputted from the control signal generating circuit 32, is in an activated state during a period in which the control signal is in a high level (activated state) and in a non-activated state during a period in which the control signal is in a low level (non-activated state). In this case, the data input receiver 34 is in an activated state (standby state) only during a short period immediately before and after a rising or falling edge of the clock signal, and otherwise in a non-activated state (terminated state).

Therefore, according to a semiconductor device in the present example, by utilizing outputs from TAPs included in the delay line, standby electric power can be reduced, and control of reception of a data signal at both rising and falling edges of the clock signal is realized in a simple structure.

Figure 11:
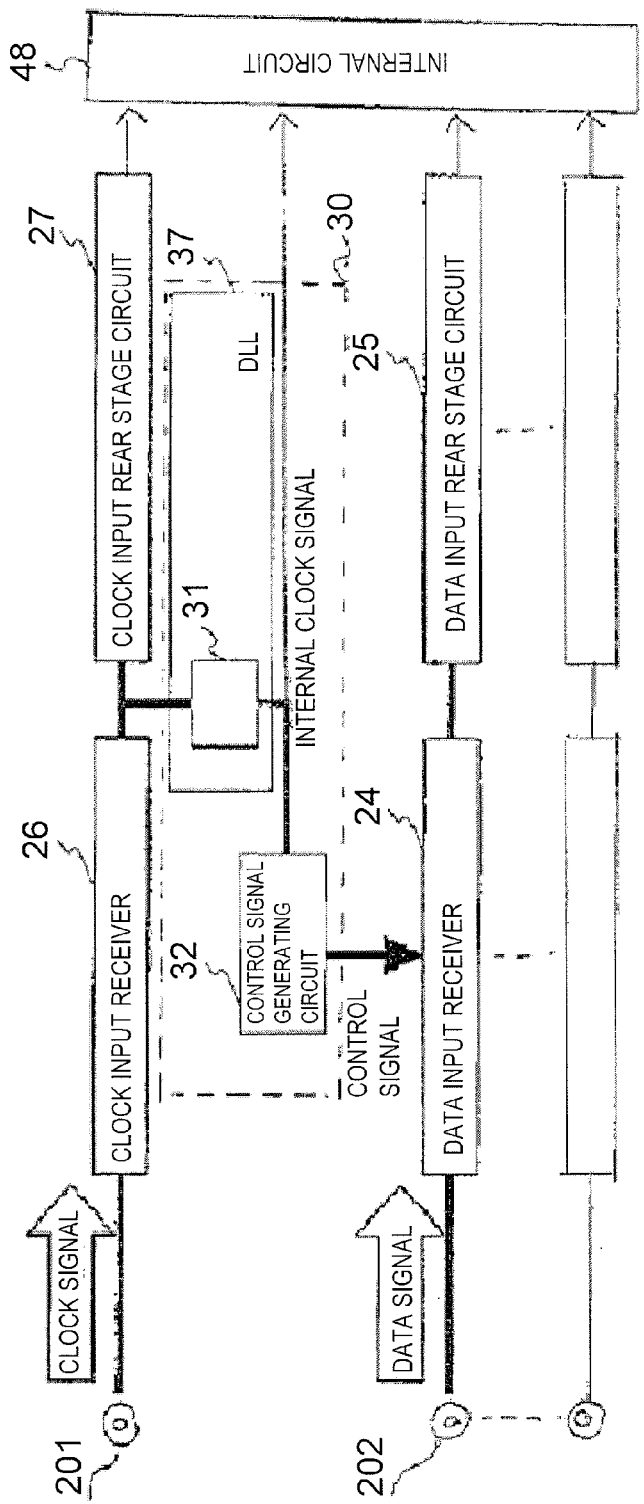
FIG. 11 is a block diagram illustrating a case in which a control signal generating circuit according to the present disclosure is applied to a semiconductor chip.

Next, a case, in which the control signal generating circuit described above is applied to a semiconductor chip, is described with reference to FIG. 11. The semiconductor chip comprises a clock signal input terminal 201 that receives a clock signal externally and a data input terminal 202 that receives a data signal. A clock signal and a data signal are supplied, respectively to a clock receiver 26 and a data input receiver 24 through the clock signal input terminal 201 and the data input terminal 202. The control signal generating unit 30 described above generates, by the DLL 37, a phase locked internal clock signal and supplies delayed clock signals, which include the internal clock signal, to the control signal generating circuit 32 through the delay circuit 31. The control signal generating circuit 32 receives the clock signals supplied from the delay circuit 31, generates a control signal, and supplies the control signal to the data input receiver 24. The data input receiver 24 is activated and deactivated in accordance with the control signal and supplies the received data signal to the data input rear stage circuit 25. In a similar manner, the clock receiver 26 supplies the received clock signal to the clock input rear stage circuit 27. The internal circuit 48 receives the data signal and the internal clock signal from the data input rear stage circuit 25 and the DLL 37, drives an output circuit that performs an output operation in synchronization with the clock signal received from the terminal 201. The internal circuit 48 receives the data signal and the clock signal from the data input rear stage circuit 25 and the clock input rear stage circuit 27, and drives a circuit other than the above output circuit, for example, an input circuit that receives an address or a command.

By controlling the activation and deactivation of the input receiver in this way with the control signal generating unit 40, electric power consumed by the input receiver can be reduced.

THIRD EXAMPLE

In the present example, a case in which the present disclosure is applied to a semiconductor device, especially to a DRAM, is described.

Figure 12:
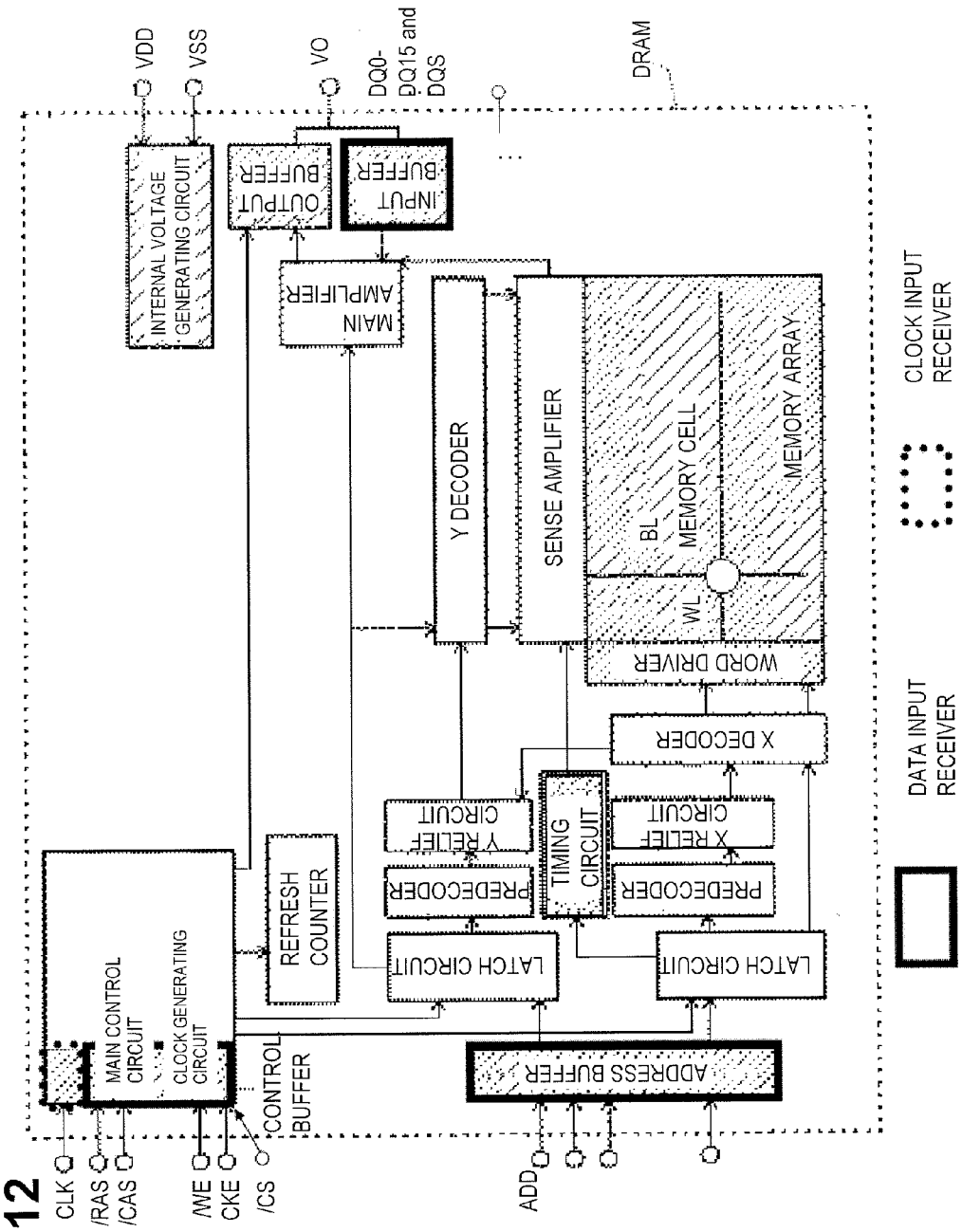
FIG. 12 is a block diagram illustrating an example of a structure of a semiconductor device in a third example.

A DRAM, a kind of a semiconductor memory device, is described for example in Patent Document 2. FIG. 12 is a block diagram illustrating a structure of the semiconductor memory device according to the present example. With reference to FIG. 12, a position indicated by a thick line in the figure corresponds to a data input receiver, and a position indicated by a dotted line corresponds to a clock receiver.

The data input receiver is an input receiver that receives a signal (for example a data signal) other than a clock signal. The clock receiver is an input receiver that receives a clock signal.

In FIG. 12, each of circuits, included in one of an address buffer, an input buffer and an main control circuit (clock generation circuit) and receiving one of a row address strobe signal /RAS, a column address strobe signal /CAS, a write enable signal /WE, a clock enable signal CKE and a chip select signal /CS, corresponds to the data input receiver.

By inputting to these data input receivers a control signal generated by the control signal generating unit (a delay circuit and a control signal generating circuit) in the first and second examples described above, and maintaining these data input receiver to be in a standby state, in which a data signal can be received, and otherwise in a terminated state, power consumption of these data input receiver in the DRAM can be reduced.

FOURTH EXAMPLE

A technology of activating an input circuit in accordance with a write command, as described in Patent Document 1, can be applied to a semiconductor device in the first to third examples described above.

A command input receiver (command input front stage circuit), i.e., a data input initial stage circuit that receives a command signal maintains an activated state irrespective of the control signal. A data input initial stage circuit other than the command input receiver is activated by the command signal and is controlled, by the control signal generated by the control signal generating unit, to be in an activated state only during a predetermined period in response to a clock signal. In this way, power consumption can be reduced further.

In each of the above described examples, description has been made using an input receiver. In the following, a concrete circuit structure of the input receiver is described.

Figure 13:
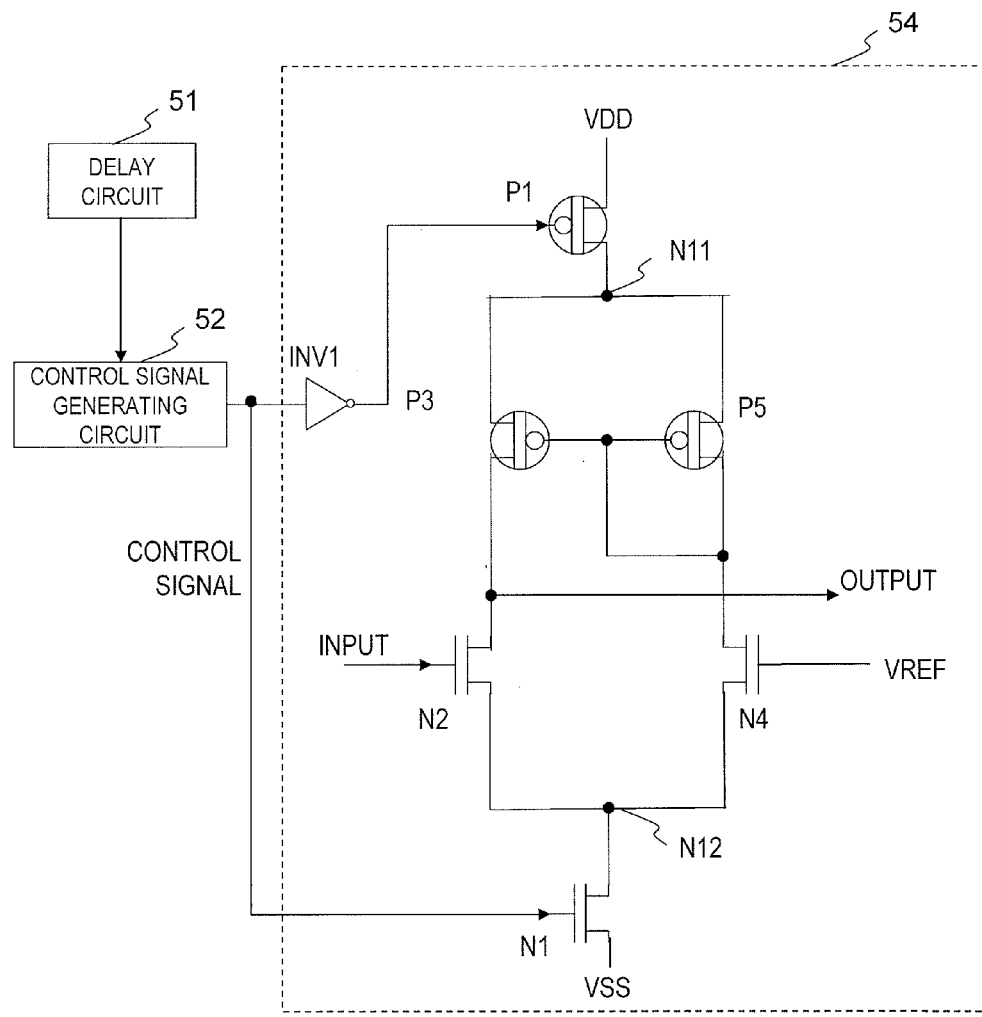
FIG. 13 is a circuit diagram illustrating a first concrete example of an input receiver (input front stage circuit).

At first, a data input receiver with a P-channel load type differential amplifier circuit is described with reference to FIG. 13.

A data input front state circuit 54 with a P-channel load type differential amplifier circuit comprises an inverter INV1, N-type transistors N1, N2 and N4, and P-type transistors P1, P3 and P5.

The inverter INV1 reverse a control signal outputted from the control signal generating circuit 52 and outputs the reversed control signal. The reversed control signal is supplied to the gate terminal of the P-type transistor P1 connected between the high voltage source VDD and the common node N11. The N-type transistor N1 is connected between the low voltage source VSS and the common node N12. The control signal outputted from the control signal generating circuit is supplied to the gate terminal of the N-type transistor N1. The N-type transistor N2 is connected between the common node N12 and the output terminal. An input signal (a data signal in the above described examples) is supplied to the gate terminal of the N-type transistor N2. The P-type transistor P3 is connected between the common node N11 and the output terminal. The P-type transistor P5 is connected between the common node N11 and the gate terminal of the P-type transistor P3. The gate terminal of the P-type transistor P5 is connected to the gate terminal of the P-type transistor P3. The N-type transistor N4 is connected between the common node N12 and the gate terminal of the P-type transistor P3. A reference voltage VREF is supplied to the gate terminal of the N-type transistor N4.

The P-type transistor P3 is connected between the common node N1 and the output terminal. An input signal (a data signal in the above described examples) is supplied to the gate terminal of the P-type transistor P3. The P-type transistor P5 is connected between the common node N1 and the gate terminal of the P-type transistor P3. The gate terminal of the P-type transistor P5 is connected to the gate terminal of the P-type transistor P3. The N-type transistor N4 is connected between the common node N2 and the gate terminal of the P-type transistor P3. A reference voltage VREF is supplied to the gate terminal of the N-type transistor N4.

In this way, by performing a control using the control signal, a current that flows steadily between the high voltage source VDD and the low voltage source VSS, though the data input receiver 54 with a p-channel load type differential amplifier, can be reduced, and power consumption can also be reduced.

Figure 14:
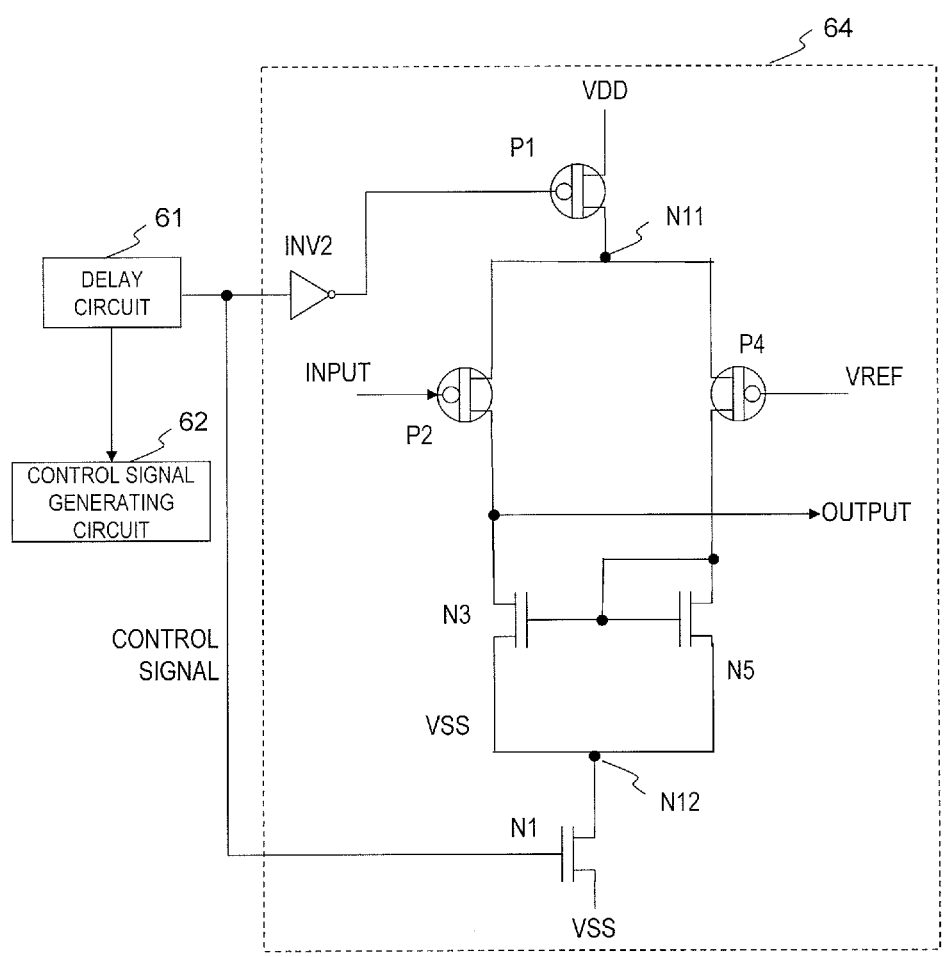
FIG. 14 is a circuit diagram illustrating a second concrete example of an input receiver.

Next, a data input receiver with an N-channel load type differential amplifier circuit is described with reference to FIG. 14.

A data input front state circuit 64 with an N-channel load type differential amplifier circuit comprises an inverter INV2, N-type transistors N1, N3 and N5, and P-type transistors P1, P2 and P4.

The control signal is supplied to the gate terminal of the N-type transistor N1 whose source terminal is connected to the low voltage source VSS. The control signal is also supplied through the inverter INV2 to the gate terminal of the P-type transistor P1 whose source terminal is connected to the high voltage source VDD.

The inverter INV2 reverses a control signal outputted from the control signal generating circuit described in the first to third examples and outputs the reversed control signal. The reversed control signal is supplied to the gate terminal of the P-type transistor P1 connected between the high voltage source VDD and the common node N11. The N-type transistor N1 is connected between the low voltage source VSS and the common node N12. The control signal outputted from the control signal generating circuit is supplied to the gate terminal of the N-type transistor N1. The N-type transistor N3 is connected between the common node N12 and the output terminal. The N-type transistor N5 is connected between the common node 12 and the gate terminal of the N-type transistor N3. The gate terminal of the N-type transistor N5 is connected to the gate terminal of the N-type transistor N3. The P-type transistor P2 is connected between the common node N11 and the output terminal. An input signal is supplied to the gate terminal of the P-type transistor P2. The P-type transistor P4 is connected between the common node N11 and the gate terminal of the N-type transistor N3. The reference voltage VREF is supplied to the gate terminal of the P-type transistor.

In this way, by performing a control using the control signal, a current that flows steadily between the high voltage source VDD and the low voltage source VSS, though the data input receiver 64 with an N-channel load type differential amplifier, can be reduced, and power consumption can also be reduced.

Figure 15:
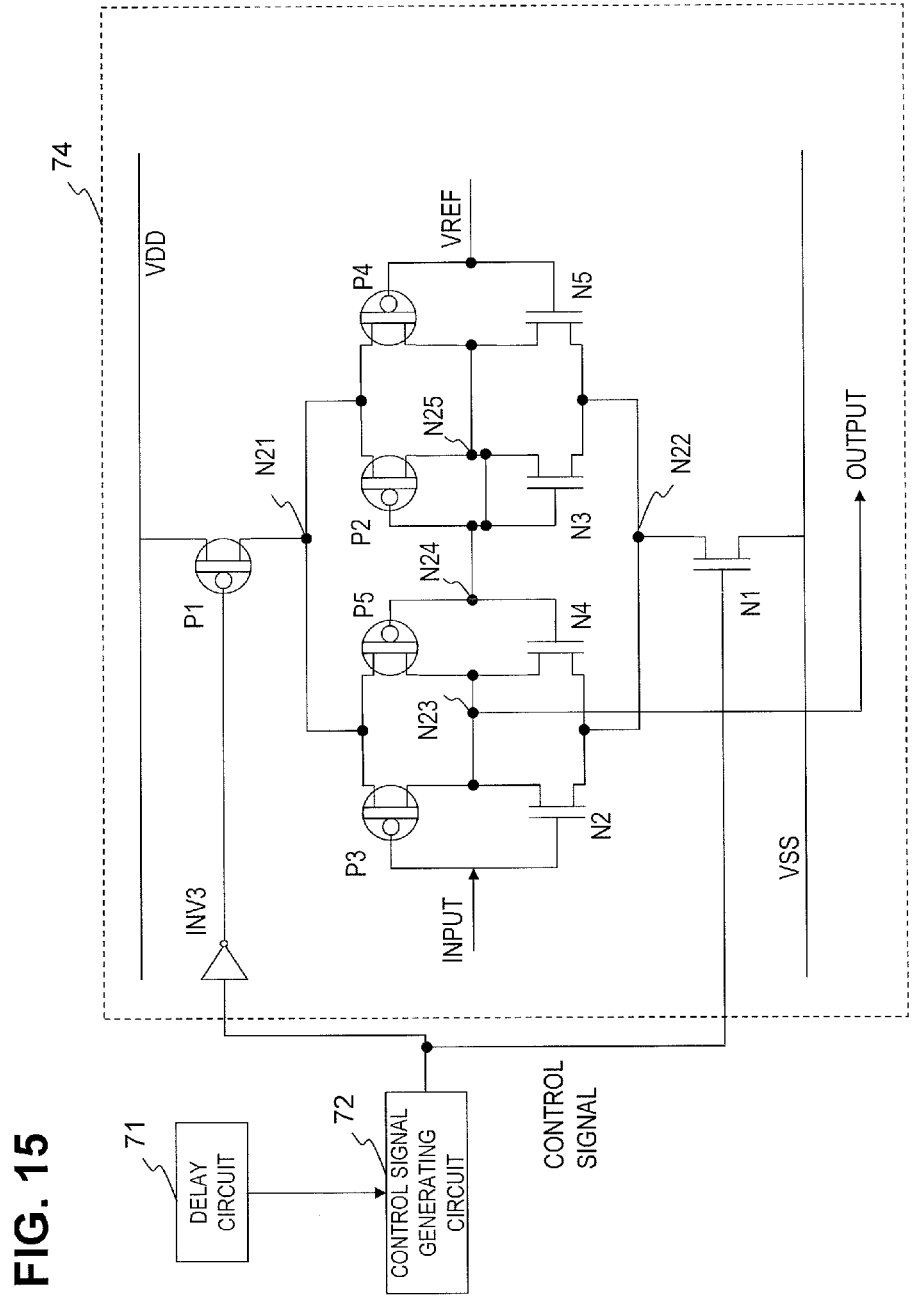
FIG. 15 is a circuit diagram illustrating a third concrete example of an input receiver.

Next, a data input receiver with an N-channel load type differential amplifier circuit and a P-channel load type differential amplifier circuit is described with reference to FIG. 15.

A data input front state circuit 74 with an N-channel load type differential amplifier circuit and a P-channel load type differential amplifier circuit comprises an inverter INV3, N-type transistors N1 to N5, and P-type transistors P1 to P5.

The control signal is supplied to the gate terminal of the N-type transistor N1 whose source terminal is connected to the low voltage source VSS. The control signal is also supplied through the inverter INV3 to the gate terminal of the P-type transistor P1 whose source terminal is connected to the high voltage source VDD.

The inverter INV3 reverses a control signal outputted from the control signal generating circuit described in the first to third examples and outputs the reversed control signal. The reversed control signal is supplied to the gate terminal of the P-type transistor P1 connected between the high voltage source VDD and the common node N21. The N-type transistor N1 is connected between the low voltage source VSS and the common node N22. The control signal is supplied to the gate terminal of the N-type transistor N1. The N-type transistor N2 and the P-type transistor P3 are connected in series between the common node N21 and the common node N22. An input signal is supplied to the gate terminals of the N-type transistor N2 and the P-type transistor P3. The connection point of the transistors N2 and P3 is connected through the common node N23 to the output terminal. The N-type transistor N4 and the P-type transistor P5 are connected in series between the common node N21 and the common node N22. The connection point of the N-type transistor N4 and the P-type transistor P3 is connected to the output terminal. The gate terminals of the N-type transistor N4 and the P-type transistor P5 are connected to the common node N24. The P-type transistor P2 and the N-type transistor N3 are connected in series between the common node N21 and the common node N22. The connection point of the P-type transistor P2 and the N-type transistor N3 is connected to the common node N25. The gate terminals of the P-type transistor P2 and the N-type transistor N3 are connected to the common node N24. The common node N24 and the common node N25 are electrically connected each other.

The P-type transistor P4 and the N-type transistor N5 are connected in series between the common node N21 and the common node N22. The connection point of the P-type transistor P4 and the N-type transistor N5 is connected to the common node N25. A reference voltage VREF is supplied to the gate terminals of the P-type transistor P4 and the N-type transistor N5.

In the present input receiver, a current that flows steadily between the high voltage source VDD and the low voltage source VSS, though the data input receiver 74 with an N-channel load type differential amplifier and P-channel load type differential amplifier, can be reduced and power consumption can also be reduced.

Figure 16:
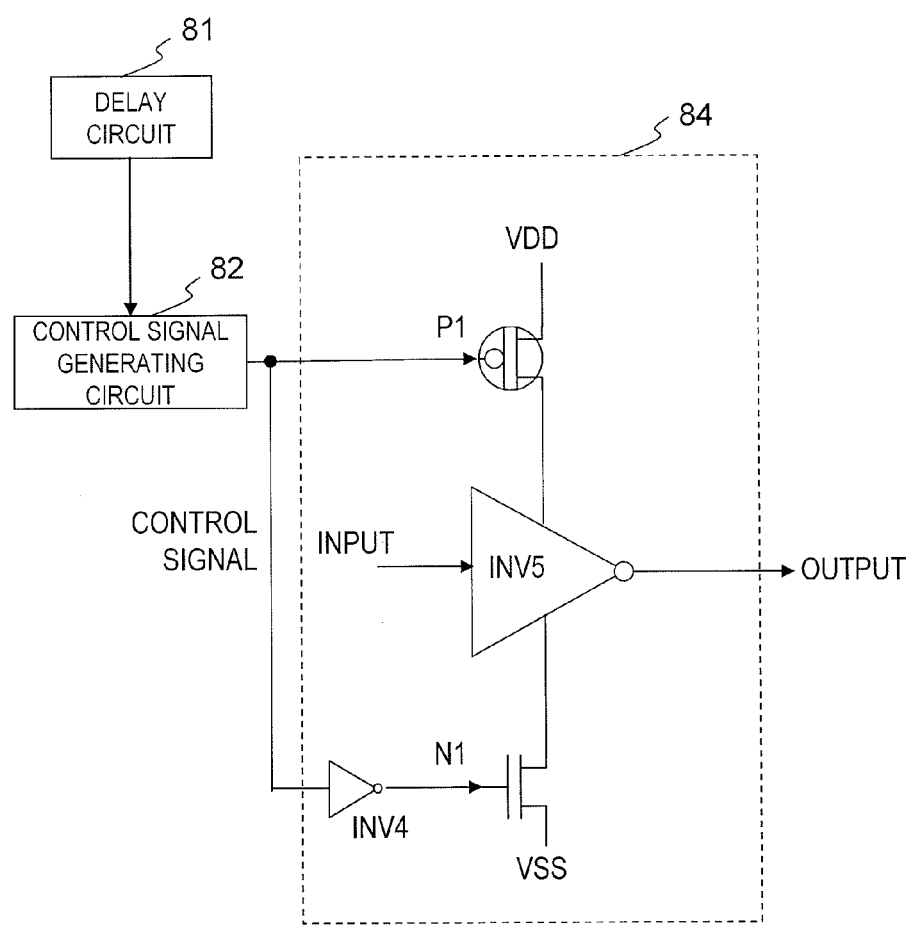
FIG. 16 is a circuit diagram illustrating a fourth concrete example of an input receiver.

Next, a data input receiver with an inverter type amplifier circuit is described with reference to FIG. 16. The data input receiver 84 comprises an inverter INV4, an N-type transistor N1, a P-type transistor P1, and an inverter type amplifier INV5.

The control signal is supplied through the inverter INV4 to the gate terminal of the N-type transistor N1 whose source terminal is connected to the low voltage source VSS. The control signal is also supplied to the gate terminal of the P-type transistor P1 whose source terminal is connected to the high voltage source VDD.

The data input receiver 84 with an inverter type amplifier comprises the P-type transistor P1, the inverter type amplifier and the N-type transistor, which are connected in series between the high voltage source VDD and the low voltage source VSS. The control signal is supplied to the gate terminal of the P-type transistor P1. The inverter type amplifier INV5 receives an input signal from the input terminal, amplifies the input signal and outputs the amplified signal.

In the present example, by preventing a leak current, power consumption in the data input receiver 64 can be reduced.

The data input receiver is an input receiver that receives a signal (for example a data signal) other than a clock signal. The data input receiver may be a circuit that receives a clock enable signal CKE, a chip select signal /CS, a row address strobe signal /RAS, a column address strobe signal /CAS, a write enable signal /WE, a data signal DQ, a data strobe signal DQS in a semiconductor memory device.

In each of the above examples, a semiconductor device with an input receiver is described as an example. However, the present example can be applied not only to an input circuit provided at a front stage but also to various input circuits provided in a semiconductor device It should be noted that other objects, features and aspects of the present disclosure will become apparent in the entire disclosure and that modifications may be done without departing the gist and scope of the present disclosure as disclosed herein and claimed as appended herewith. Also it should be noted that any combination of the disclosed and/or claimed elements, matters and/or items may fall under the modifications aforementioned.

What is claimed is:

1. A semiconductor device comprising:
a control signal generating circuit that generates a control signal that is repeatedly in an active state during periods around at least one of a sequence of rising edges and a sequence of falling edges of a clock signal and otherwise in an inactive state; and
a data input circuit that receives the control signal and is controlled to be in an activated state, in which a data signal can be received, while the control signal is in the active state, and controlled to be in a de-activated state, in which a data signal cannot be received, while the control signal is in the inactive state.

2. The semiconductor device according to claim 1, wherein the control signal generating circuit forces the control signal to be in the active state while a delayed signal, given by delaying the clock signal by a predetermined period of time, is in a first level and forces the control signal to be in the inactive state while the delayed signal is in a second level.

3. The semiconductor device according to claim 1, further comprising a delay circuit that generates a signal by delaying the clock signal by a predetermined period of time and outputs the delayed signal.

4. The semiconductor device according to claim 3, wherein
the delay circuit comprises a delay line of a delay locked loop including a plurality of delay elements;
each of the plurality of the delay elements outputs a signal given by delaying the clock signal by a predetermined period of time; and
the control signal generating circuit generates the control signal by combining the signals outputted from the plurality of delay elements.

5. The semiconductor device according to claim 4, wherein the control signal generating circuit performs an exclusive OR operation between a signal outputted from one of the plurality of the delay elements provided at a front stage of a delay element that outputs an output signal when the delay locked loop is locked and a signal outputted from one of the plurality of the delay elements provided at a rear stage of the delay element that outputs the delay signal, and forces the control signal to be in the active state while the exclusive OR is in a high level and otherwise forces the control signal to be in the inactive state.

6. The semiconductor device according to claim 4, wherein the control signal generating circuit performs a logical AND operation between a logically inverted one of signals and the other of the signals, which are a signal outputted from one of the plurality of the delay elements provided at a front stage of a delay elements that outputs an output signal when the delay locked loop is locked and a signal outputted from one of the plurality of the delay elements provided at a rear stage of the delay element that outputs the delay signal, and forces the control signal to be in the active state while the logical AND is in a high level and otherwise forces the control signal to be in the inactive state.

7. The semiconductor device according to claim 1, wherein the data input circuit is an amplifier circuit that amplifies the data signal and outputs the amplified data signal.

8. The semiconductor device according to claim 7, wherein the amplifier circuit comprises at least one of a P-channel load type differential amplifier circuit, an N-channel load type differential amplifier circuit and an inverter type amplifier.

9. The semiconductor device according to claim 1, further comprising a memory cell, wherein
the data input circuit receives a data signal for the memory cell.

10. The semiconductor device according to claim 9, wherein the data input circuit is included in at least one of an address buffer, an input buffer and an main control circuit (clock generation circuit) and receives at least one of a row address strobe signal /RAS, a column address strobe signal /CAS, a write enable signal /WE, a clock enable signal CKE and a chip select signal /CS.

11. A semiconductor device control method, comprising:
delaying a clock signal by a predetermined period of time;
generating a control signal that is repeatedly in an active state during periods around at least one of a sequence of rising edges and a sequence of falling edges of the clock signal by referring to the delayed clock signal; and
forcing a data input circuit to be in a standby state, in which a data signal can be received, while the control signal is in the active state, and otherwise forcing the data input circuit to be in a terminated state.

12. The semiconductor device control method according to claim 11, wherein the generating comprises forcing the control signal to be in the active state while a signal given by delaying the clock signal by a predetermined period of time is in a low level, and otherwise to be in the inactive state.

13. The semiconductor device control method according to claim 11, wherein the generating comprises forcing the control signal to be in the active state while a signal given by delaying the clock signal by a predetermined period of time is in a high level, and otherwise to be in the inactive state.

14. The semiconductor device control method according to claim 11, wherein the delaying comprises generating a signal by delaying the clock signal by a predetermined period of time and outputting the signal by each of a plurality of the delay elements included in a delay line of a delay locked loop; and the generating comprises combining the signals outputted from the plurality of delay elements to generate the control signal.

15. The semiconductor device control method according to claim 14, wherein the generating comprises:

performing an exclusive OR operation between a signal outputted from one of the plurality of the delay elements provided at a front stage of a delay elements that outputs an output signal when the delay locked loop is locked and a signal outputted from one of the plurality of the delay elements provided at a rear stage of the delay element that outputs the delay signal; and forcing the control signal to be in the active state while the exclusive OR is in a high level, and otherwise forcing the control signal to be in the inactive state.

16. The semiconductor device control method according to claim 14, wherein the generating comprises:

performing a logical AND operation between a logically inverted one of signals and the other of the signals, which are a signal outputted from one of the plurality of the delay elements provided at a front stage of a delay element that outputs an output signal when the delay locked loop is locked and a signal outputted from one of the plurality of the delay elements provided at a rear stage of the delay element that outputs the delay signal; and forcing the control signal to be in the active state while the logical AND is in a high level and otherwise forcing the control signal to be in the inactive state.

* * * * *